US006980060B2

(12) United States Patent
Boerstler et al.

(10) Patent No.: US 6,980,060 B2
(45) Date of Patent: Dec. 27, 2005

(54) ADAPTIVE METHOD AND APPARATUS TO CONTROL LOOP BANDWIDTH OF A PHASE LOCK LOOP

(75) Inventors: David William Boerstler, Round Rock, TX (US); Eskinder Hailu, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 120 days.

(21) Appl. No.: 10/693,031

(22) Filed: Oct. 23, 2003

(65) Prior Publication Data

US 2005/0088244 A1 Apr. 28, 2005

(51) Int. Cl.[7] .......................... H03L 7/085; H03L 7/093
(52) U.S. Cl. ........................................ 331/17; 331/25
(58) Field of Search ................ 331/1 A, 4, 8, 331/10–12, 14, 17–18, 25; 327/156–159; 332/127; 360/51; 375/376; 455/260

(56) References Cited

U.S. PATENT DOCUMENTS

| 4,007,429 | A | * | 2/1977 | Cadalora et al. .............. 331/17 |
| 4,131,862 | A | | 12/1978 | Black et al. |
| 5,113,152 | A | | 5/1992 | Norimatsu |
| 5,202,924 | A | * | 4/1993 | Richards, Jr. ................. 381/13 |
| 5,272,452 | A | | 12/1993 | Adachi et al. |
| 6,060,953 | A | | 5/2000 | Tsai |
| 6,420,917 | B1 | * | 7/2002 | Klemmer ..................... 327/156 |
| 2004/0090273 | A1 | * | 5/2004 | Chang et al. .................. 331/16 |

FOREIGN PATENT DOCUMENTS

EP 0 782 271 A1 7/1997

OTHER PUBLICATIONS

Fahim, A.M. and Elmasry, M.I.; "A Fast Lock Digital Phase-Locked-Loop Architecture for Wireless Applications"; *IEEE Transactions on Circuits and Systems-II: Analog and Digital Signal Processing*; Feb. 2003; vol. 50, No. 2; pp. 63-72.

Lee, Joonsuk and Kim, Beomsup; "A Low Noise Fast Lock Phase Locked Loop With Adaptive Bandwidth Control"; *IEEE Journal of Solid-State Circuits*; Aug. 2000; vol. 35, No. 8; pp. 1137-1145.

Roh, Gyoung-Tae, Lee, Yong Hoon and Kim, Beomsup; "Optimum Phase Acquisition Technique for Charge Pump PLL," *IEEE Transactions on Circuits and System-II: Analog and Digital Signal Processing*; Sep. 1997; vol. 44, No. 9; pp. 729-740.

* cited by examiner

Primary Examiner—David Mis

(74) Attorney, Agent, or Firm—Carr LLP; Diana R. Gerhardt

(57) ABSTRACT

Disclosed is a PLL (Phase Lock Loop) reducing the lock-in-time of the phase lock loop by altering the impedance of the damping resistor portion of the included LPF (Low Pass Filter) as a function of the difference in frequency or phase between a PLL applied reference frequency and the output frequency provided by the VCO (Voltage Controlled Oscillator) portion of the PLL. This variable impedance is accomplished by introducing a feed forward path that switches a capacitor in and out of the circuit in accordance with the difference frequency. One embodiment uses a mixer to provide the difference frequency signal.

9 Claims, 7 Drawing Sheets

US 6,980,060 B2

ADAPTIVE METHOD AND APPARATUS TO CONTROL LOOP BANDWIDTH OF A PHASE LOCK LOOP

TECHNICAL FIELD

The invention relates to adaptive control of the loop bandwidth of a PLL (Phase Lock Loop).

BACKGROUND

In the majority of PLL systems, there is an inherent tradeoff between reducing 'lock in time' and jitter that results from noise in the reference signal. A narrow band width attenuates small noise from the reference/input signal, thereby resulting in reduced noise and induced jitter at the output. However, reduced bandwidth implies an increase in lock-in-time of the PLL. There have been many approaches used to reducing lock-in-time of PLLs. These include digital/DSP (Digital Signal Processing) methods, dual loop/PLL architectures, feed forward compensation techniques, and variable loop bandwidth methods. In the DSP method, the phase error is fed in to a 'fast DSP processor' whose output is then used to adjust the center operating frequency of a VCO (Voltage Controlled Oscillator). Once the error is reduced below some threshold, the VCO voltage from the DSP will be fixed and the PLL loop will take over. In the dual loop/PLL approach, the first loop is used to accomplish a channel select. Since the desired channel is externally selected, the first loop will then quickly lock-in to the desired channel. This channel is then fed to the second PLL loop. In the feed forward method, an estimate of the frequency of the input/reference clock is made which is then used to set the VCO center frequency. Once this is done, the PLL loop can take over. By far the most common approach to reducing lock-in-time involves changing loop parameters. In particular, it involves varying the filter time constants to vary the loop bandwidth. There are also various complicated or otherwise unwieldy techniques for adaptively changing loop bandwidth parameters.

It would be desirable to provide a relatively simple and straightforward approach to varying the loop bandwidth.

SUMMARY OF THE INVENTION

The present invention comprises using a "feed forward" signal in combination with a switched-capacitor to effect a variation in loop bandwidth of a PLL.

BRIEF DESCRIPTION OF THE DRAWINGS

For a more complete understanding of the present invention, and its advantages, reference will now be made in the following Detailed Description to the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention with unnecessary detail.

Figure 1:
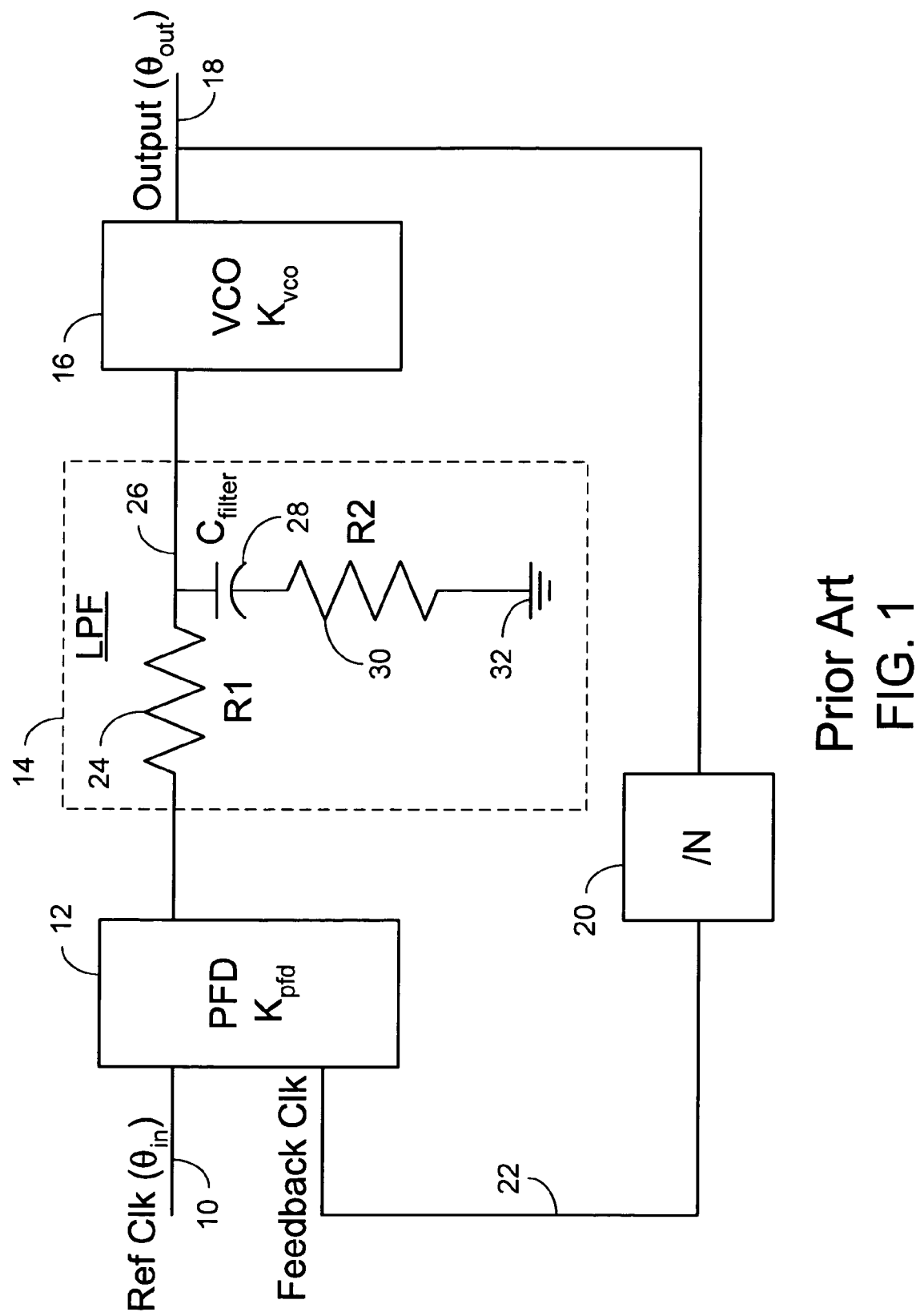
FIG. 1 is a block diagram of a typical prior art PLL.

In FIG. 1, a reference clock signal is applied on a lead 10 to a first input of a PFD (Phase/Frequency Detector) 12. An LPF (Low Pass Filter) 14 is connected between an output of PFD 12 and an input of a VCO (Voltage Controlled Oscillator) 16. Although not required, the frequency of an output signal at an output lead 18 of the VCO is a multiple (or sub multiple) of the reference frequency signal applied on lead 10. Thus a frequency divider or adjuster 20 is used to revise the frequency of the signal on lead 18 to a frequency which is the same as the reference frequency when the PLL (Phase Lock Loop) circuit of FIG. 1 is in a locked condition. This adjusted frequency appears at the output of block 20 on a lead 22 which provides a feedback clock second input to PFD 12.

Within LPF 14, there is typically a resistance shown as resistor 24 which is also designated as R1. Resistor 24 is connected between an input of the LPF and an output lead 26 of the LPF. A capacitor 28 is connected in series with a resistance 30 between lead 26 and a ground connection 32. Capacitor 28 is further designated $C_{filter}$ and resistor 30 is further designated as R2. Resistor 30 is often referred to in the art as a damping resistor.

Figure 2:
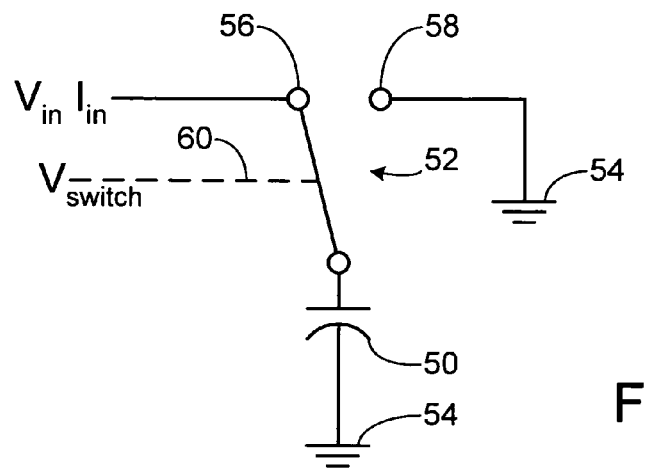
FIG. 2 is a circuit diagram of a simplified switched capacitor circuit.

FIG. 2 illustrates a basic switched capacitor circuit. As shown, a capacitor 50 is connected between a common lead of a switch 52 and ground 54. One terminal 56, of switch 52, is connected to a source of energy, such as a battery source, while another terminal 58 is connected to a reference potential or ground. For purposes of discussion, a lead connected to terminal 56 is labeled $V_{in}$ and $I_{in}$ thereby indicating an applied voltage and resulting current. A dash line 60, which is also labeled $V_{switch}$, is used to represent a switching action of switch 52 between contacts or terminals 56 and 58 to charge capacitor 50 in one position and discharge it in the other position.

Figure 3:
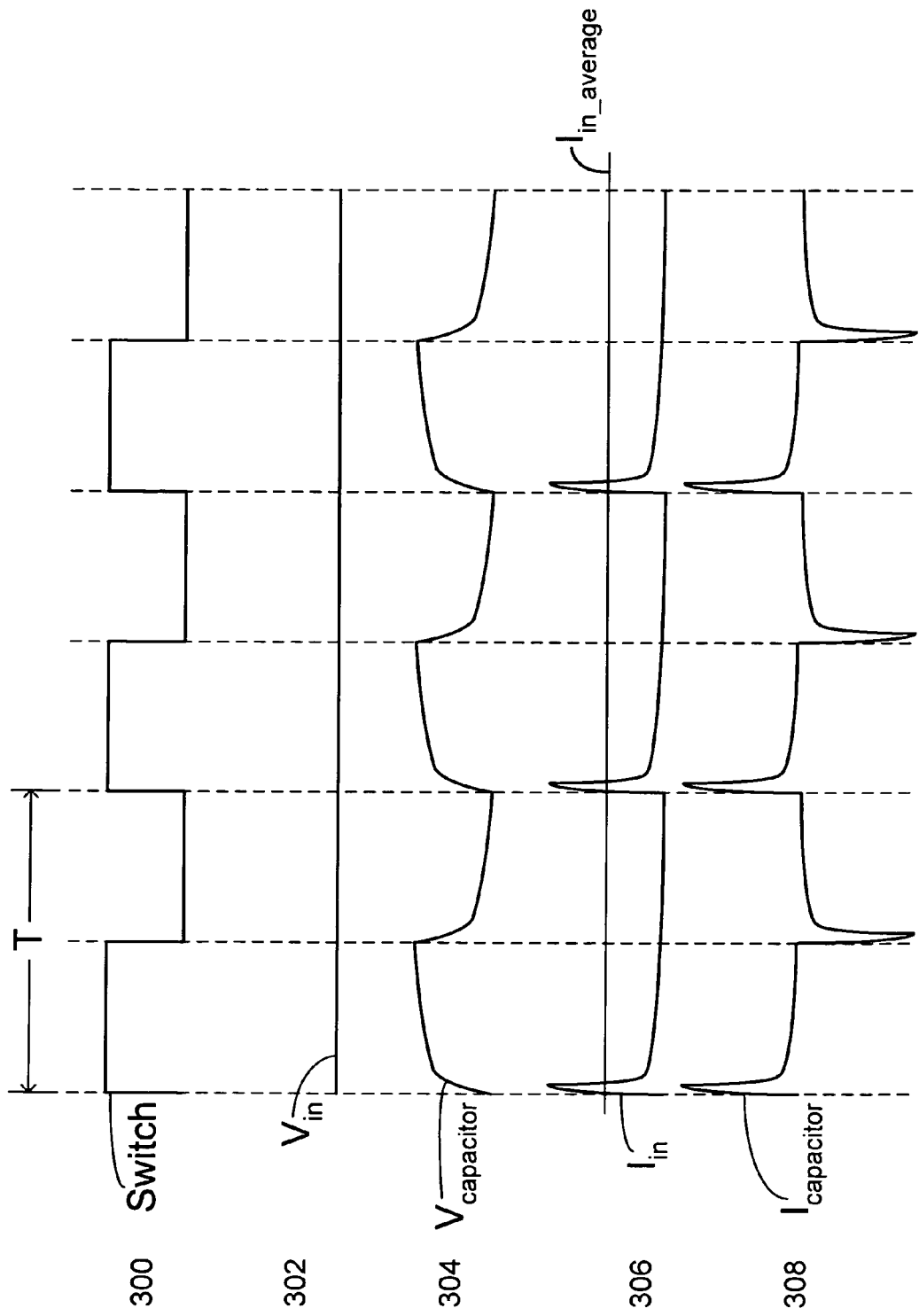
FIG. 3 comprises a set of waveforms used in explaining the use of FIG. 2 in providing a variable impedance in FIG. 4.

A plurality of signal waveforms are presented in FIG. 3. A first waveform is representative of a switching signal of a given frequency that might be applied to the switch of FIG. 2 or 4. Waveform 300 is shown to have a period of "T" for one cycle of operation. A waveform 302 is representative of the substantially constant voltage that would appear at terminal 56 of the switch 52 or at the point Node N of FIG. 4. Waveform 304 is representative of the voltage appearing across the plates of capacitor 50 with the constant voltage $V_{in}$ applied to terminal 56 of FIG. 2. Similarly, a waveform 306 is representative of the current flowing into capacitor 50 as a result of the action of switching signal 300 and the applied voltage $V_{in}$. Waveforms 304 and 306 are further designated as $V_c$ (or $V_{capacitor}$) and $I_{in}$, respectively. Finally, a waveform 308 is representative of the current flowing into capacitor 50 from terminal 56 and out of capacitor 50 to terminal 58 and to ground 54. As the frequency of the switch signal 300 decreases, the current $I_{in}$ decreases in total amount, thereby increasing the effective resistance as presented infra in connection with formulas presented in the technical discussion.

Figure 4:
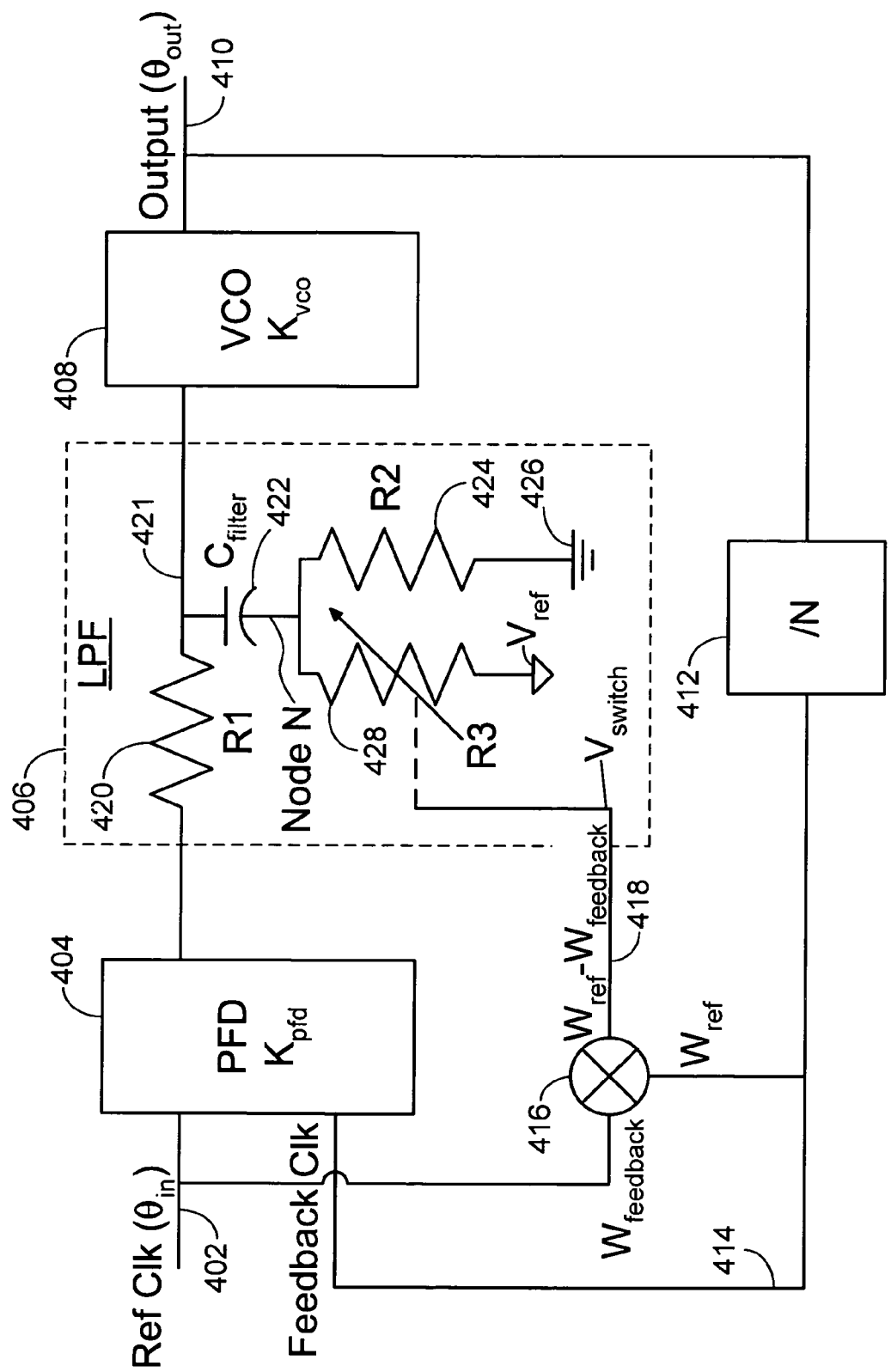
FIG. 4 is a combined circuit/block diagram of a PLL.

In FIG. 4, a reference clock signal is applied on a lead 402 to a first input of a PFD 404. An LPF 406 is connected between an output of PFD 404 and an input of a VCO 408. Again, the frequency of an output signal at an output lead 410 of the VCO 408 is a multiple (or sub multiple) of the reference frequency signal applied on lead 402. Thus, a frequency divider or adjuster 412 is used to revise the frequency of the signal on lead 410 to a frequency which is the same as the reference frequency when the PLL (Phase Lock Loop) circuit is in a stable and locked condition. This adjusted frequency appears at the output of block 412 on a lead 414 which provides a feedback clock second input to PFD 404.

Thus far, FIG. 4 is similar to the prior art FIG. 1. However, in FIG. 4, a frequency mixer or difference signal generating means 416 is used to mix received signals at frequencies $W_{feedback}$ and $W_{ref}$ from adjuster 412 and reference input 402, respectively. An output signal $W_{ref}-W_{feedback}$ from mixer 416 is provided on a lead 418. This signal, with a frequency of $W_{ref}-W_{feedback}$, is of a frequency indicative of the difference between the reference frequency and the output of the VCO. In the locked state, the frequency of the output signal of mixer 416 reduces to zero. In other words, the output signal is a DC or close to DC value.

A further difference of FIG. 4 over FIG. 1 lies within LPF 406. As shown, an LPF input resister 420 is connected between the output of PFD 404 and a lead 421 providing an output signal from LPF 406. Resistor 420 is further designated as R1. A filter capacitor 422 is connected in series with a damping resister 424 between lead 421 and a ground connection 426. The capacitor 422 is further designated as $C_{filter}$ while the damping resistor 424 is further designated as R2. A variable resistance or impedance 428 is connected in parallel with R2 424. The impedance of resistor 428 varies from substantially infinite to some much lower value as a function of the frequency of a signal applied on a $V_{switch}$ lead 418. Although impedance 428 is shown as a variable resistor, this entity is implemented in the form of the switched capacitor of FIG. 2.

As known to those skilled in the art, variable resistors have been previously implemented in integrated chip circuits in switched capacitor format. When the frequency of the switching signal to a switched capacitor is high, the resistance is low and when the frequency reduces to near zero, the resistance approaches an infinite value.

As previously mentioned, FIG. 1 shows a typical prior art charge pump based PLL architecture. The LPF 14 is a simple RC type even though active filters can also be used. Assuming the LPF 14 operates in a regime such that the PFD 12 can be modeled as a continuous time machine with gain $K_{pfd}$, and assuming the VCO as a perfect integrator with gain $K_{vco}$, and for ease of calculation setting divider ratio, N equal to 1, we will arrive at the following loop equation (1):

$$\theta_{out}(w)/\theta_{in}(w)=(K+jwK\tau_2)/(K-w^2\tau_1+jw(1+K\tau_2)) \quad (1)$$

where $K=K_{pfd}K_{vco}$, $$\tau_1=(R_1+R_2)C_{filter}, \text{ and} \quad (2)$$

$$\tau_2=R_2C_{filter} \quad (3)$$

$\theta_{out}$ is the phase of signal generated by the VCO and $\theta_{in}$ is the phase of the reference clock.

The natural angular frequency, which also corresponds to the loop bandwidth, is given by equation (4):

$$\omega_n=K/\tau_1 \quad (4)$$

Therefore, to obtain a large bandwidth, it is appropriate to minimize $\tau_1$ and/or maximize K.

Reference may now be made to the simplified switched capacitor resistor circuit of FIG. 2 along with the timing diagram waveforms of FIG. 3. It may be assumed that $V_{in}$ (FIG. 2) is quasi-stationary with respect to $V_{switch}$. This assumption is further explained infra. When $V_{switch}$ is high, current is flowing into the capacitor 50 from $V_{in}$. This current $I_{in}$, taking into account the effect of finite switch resistance, is shown in FIG. 3 as waveform 304 for a $V_{switch}$ frequency of that shown in waveform 300. When the potential of $V_{switch}$ is low, $V_{in}$ is disconnected from the capacitor 50 and capacitor 50 is discharged. This process is repeated in accordance with the frequency of the $V_{switch}$ signal 300.

The average current that is extracted from $V_{in}$ can be computed as follows. Assuming $V_c$ (waveform 302) reached $V_{in}$, the total charge $Q_{tot}$ deposited by $V_{in}$ into capacitor C during the time when switch 58 (waveform 300) is ON is given by equation (5):

$$Q_{tot}=CV_{in} \quad (5)$$

In other words during each switch period (T), an amount of charge equal to $CV_{in}$ is transferred from node $V_{in}$ to the capacitor. Therefore the average current is then:

$$I_{av}=CV_{in}/T \quad (6)$$

The average resistance seen looking into node $V_{in}$ is then:

$$R_{av}=V_{in}/I_{av}=1/fC \text{ where } f=1/T \quad (7)$$

Equation (6) is arrived at by assuming ideal switches.

Next, $R_{av}$ may be derived for the case where the switches exhibit finite resistance. In this case, the total amount of charge transferred to the capacitor C is obtained by integrating the instantaneous input current over the duration of 0 to T/2.

The instantaneous current is given by:

$$I(t)=(V_{in}/R)e^{(-t/RC)} \quad (8)$$

where R is the switch ON resistance.

$Q_{tot}=\int I(t)dt$ where the integral limits are from t=0 to t=T/2
Expressed differently, $$Q_{tot}=-V_{in}C[e^{(-T/(2RC))}-1] \quad (9)$$

$I_{av}$ may be obtained by using the following equation:

$$I_{av}T=Q_{tot} \quad (10)$$

$R_{av}$ is given by (7).
Therefore:

$$R_{av}=-1/(fC[e^{(-2fRC)}-1]) \text{ where } f=1/T \quad (11)$$

It may be noted, that, in the limit as R approaches zero, equation (11) reduces to (7)

FIG. 4 shows a simple application of a variable impedance (the switched capacitor resistor of FIG. 2) within a PLL to dynamically adjust loop bandwidth. For ease of argument, it may be assumed that R1 (420) is zero, the loop bandwidth is determined by K and the time constant $\tau$:

$$\tau=(R_2//R_3)C_{filter} \quad (12)$$

where $(R_2//R_3)$ is the effective impedance of resistors 424 and 428 connected in parallel.

As previously noted, variable resistor 428 is actually a switched capacitor resistor like in FIG. 2. The reference and feedback clocks on leads 402 ($W_{ref}$) and 414 ($W_{feedback}$), respectively, are 'mixed' using the mixer 416. The resulting signal with a fundamental frequency of $W_{ref}-W_{feedback}$ is then used to control the value of the switched capacitor resistor. When the PLL of FIG. 4 is significantly out of lock, that is when the difference frequency $W_{ref}-W_{feedback}$ is large, $R_3$ or resistance 428 is reduced. This directly results in increased loop bandwidth as set forth in equation 12. When the PLL achieves lock, that is, when $W_{ref}$ and $W_{feedback}$ are the same, the mixer's output will be a dc signal corresponding with an infinite impedance in the leg of switched capacitor resistor $R_3$. In this condition, the PLL loop bandwidth is only determined by the choice of $R_2$ and $C_{filter}$ (resistor 424 and capacitor 422, respectively). In summary, using the switched capacitor resistance in the feed forward path allows the dynamic adjustment of loop bandwidth, which directly translates into improved transient response.

Figure 5:
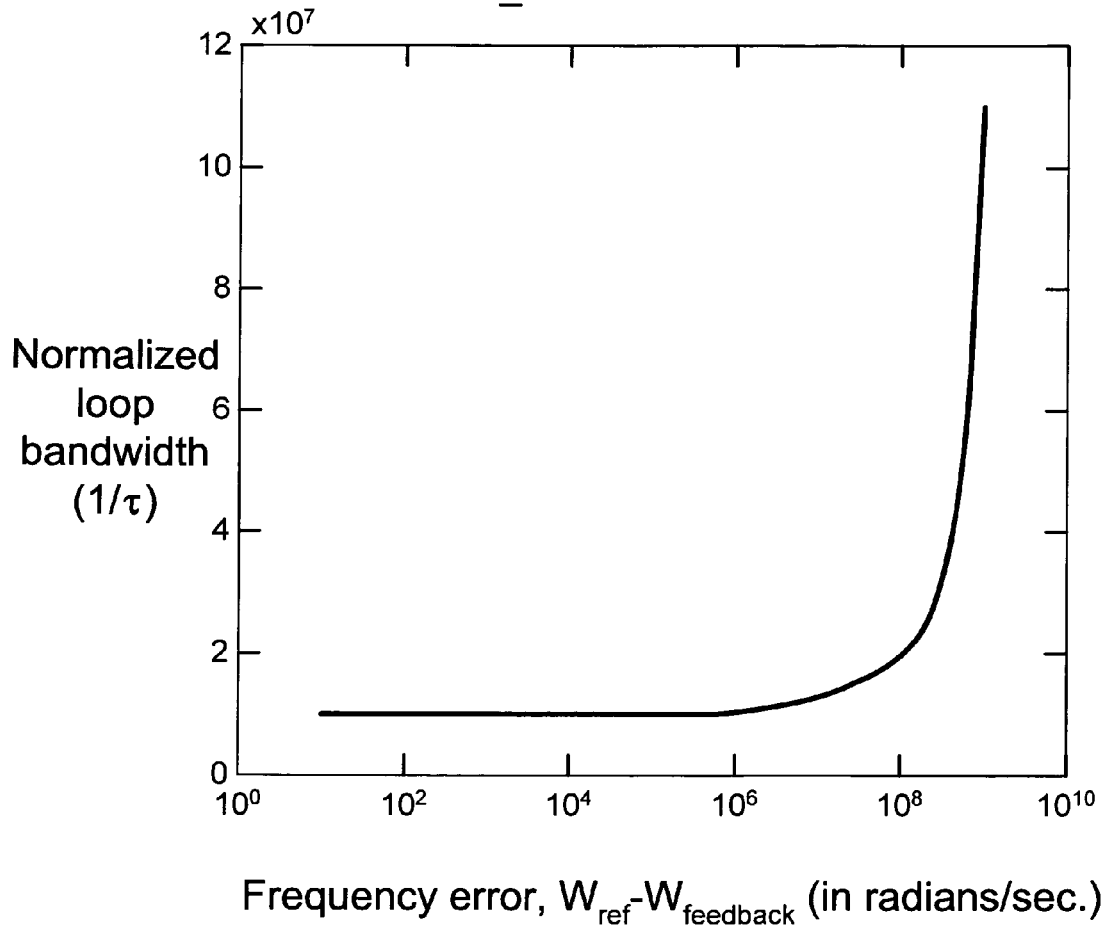
FIG. 5 is a graph illustrating normalized PLL bandwidth versus frequency error.

FIG. 5 shows a simulation of normalized loop bandwidth versus frequency error. For the purposes of this simulation, the components were given the following values.

$C_{filter}$=10 pF, C=1 1 pF, $R_2$=10000 ohms, and $R_{on\_switch}$=1000 ohms

Where $C_{filter}$ is the capacitor in the LPF, C is the capacitor in the switched capacitor resistor, and $R_{onswitch}$ is the ON resistance of the switch in the switch capacitor resistor.

It may be noted from FIG. 5 that the loop bandwidth is increased by a factor of ten for a frequency error of 1 GHz.

Figure 6:
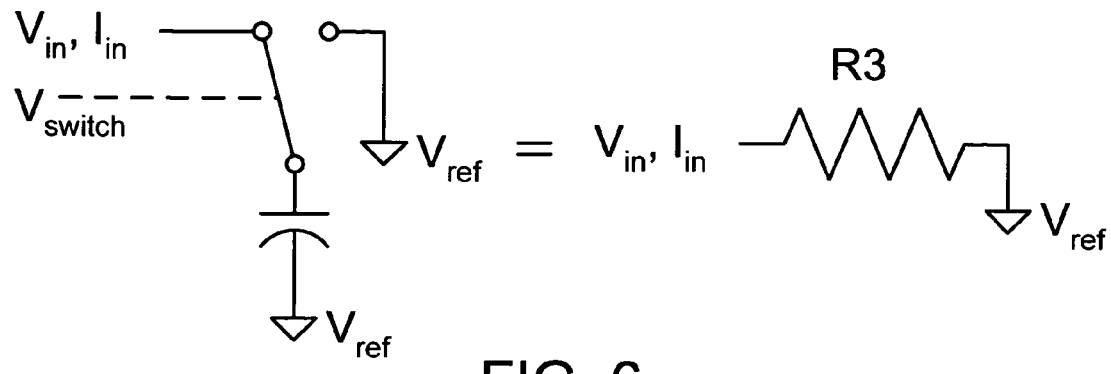
FIG. 6 is an implementation of R3 of FIG. 3.

Turning now to FIG. 6, a simplified version of R3 is illustrated. In FIGS. 4 and 6, the switched capacitor R3 is referenced with respect to $V_{ref}$ rather than ground. $V_{ref}$ is configured to have a lower potential than ground. Explanation for this will follow below.

In the discussion above, $V_{in}$ is illustrated as quasi-stationary with respect to $V_{switch}$. It is the choice of $V_{ref}$ that makes this argument valid.

Turning back to FIG. 4 and referring to the characteristics with respect to frequency of the positive terminal of resistor R2 (Node N) in FIG. 4, the voltage at Node N in FIG. 4 can be found using the following expression $Vn(s)=Vpfd(s)[R2//R2]/[(R2//R3)+1/sC+R1]$ Wherein Vn(s) is the voltage at Node N, and Vpfd(s) is the output of the PFD. In the above equation, low frequency signals are more attenuated than high frequency signals.

Figure 7:
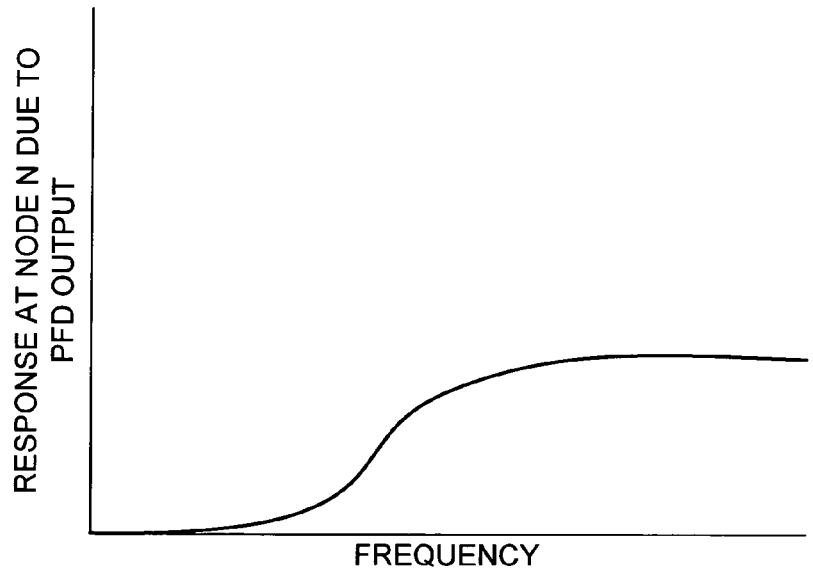
FIG. 7 illustrates a plot of a frequency response at a node N in FIG. 4.
Figure 8:
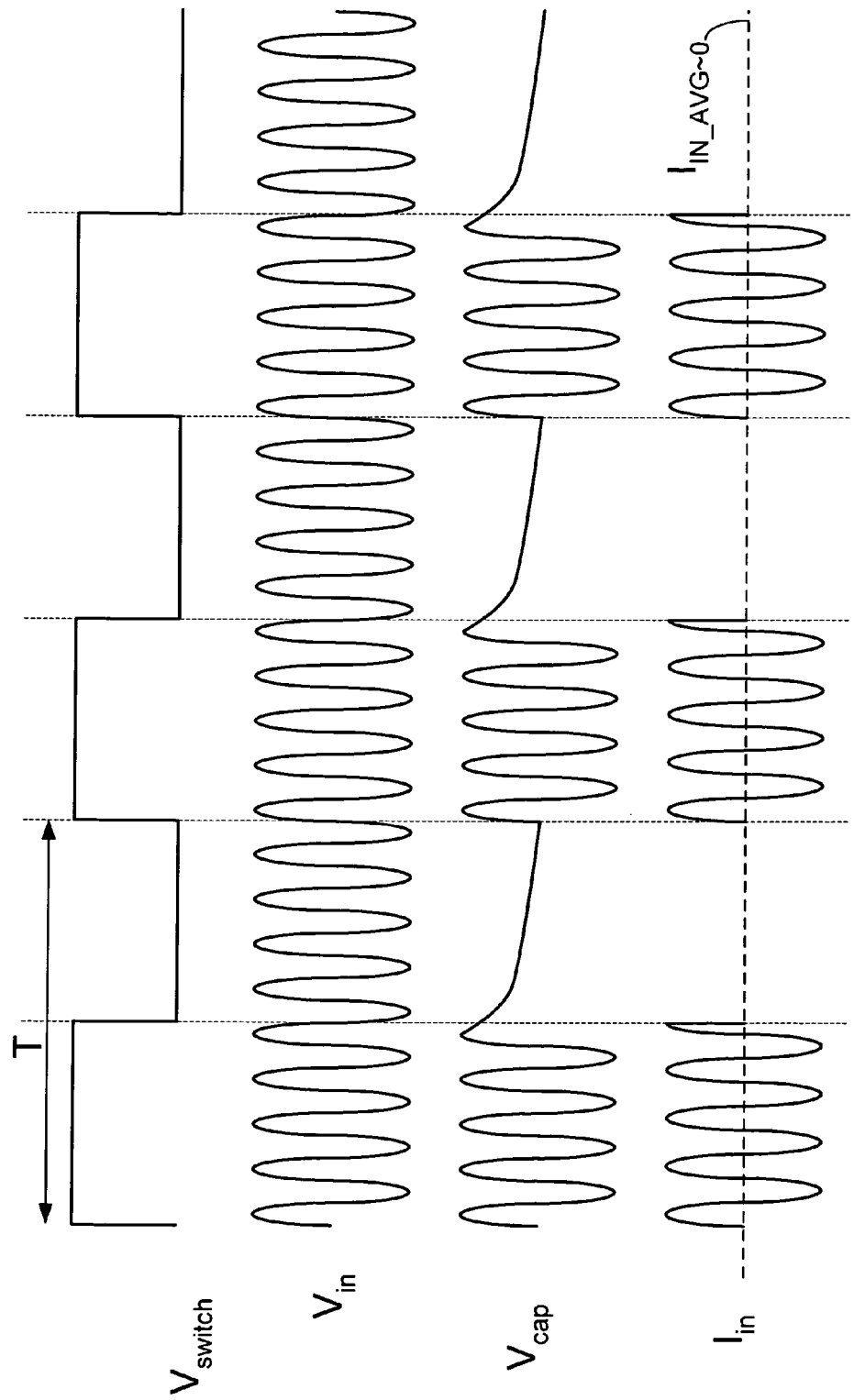
FIG. 8 illustrates voltage/current characteristics for a switched capacitor resistor which is connected to node N, wherein the $V_{in}$ applied to the switched capacitor resistor corresponds to the voltage at node N, and $V_{ref}$=ground.

FIG. 7 illustrates a typical plot of the frequency response at node n in FIG. 4. In FIG. 8, in one embodiment, $V_{ref}$ and ground are at the same potential. Therefore, the characteristics for R3 of FIG. 8 can manifest. Note that when the frequency of $V_{in}$ becomes comparable to or larger than that of $V_{switch}$, $I_{in\_average}$ is approximately equal to zero. In this case, the effective resistance provided by R3 is very large, and there is little modulation of PLL loop bandwidth.

Figure 9:
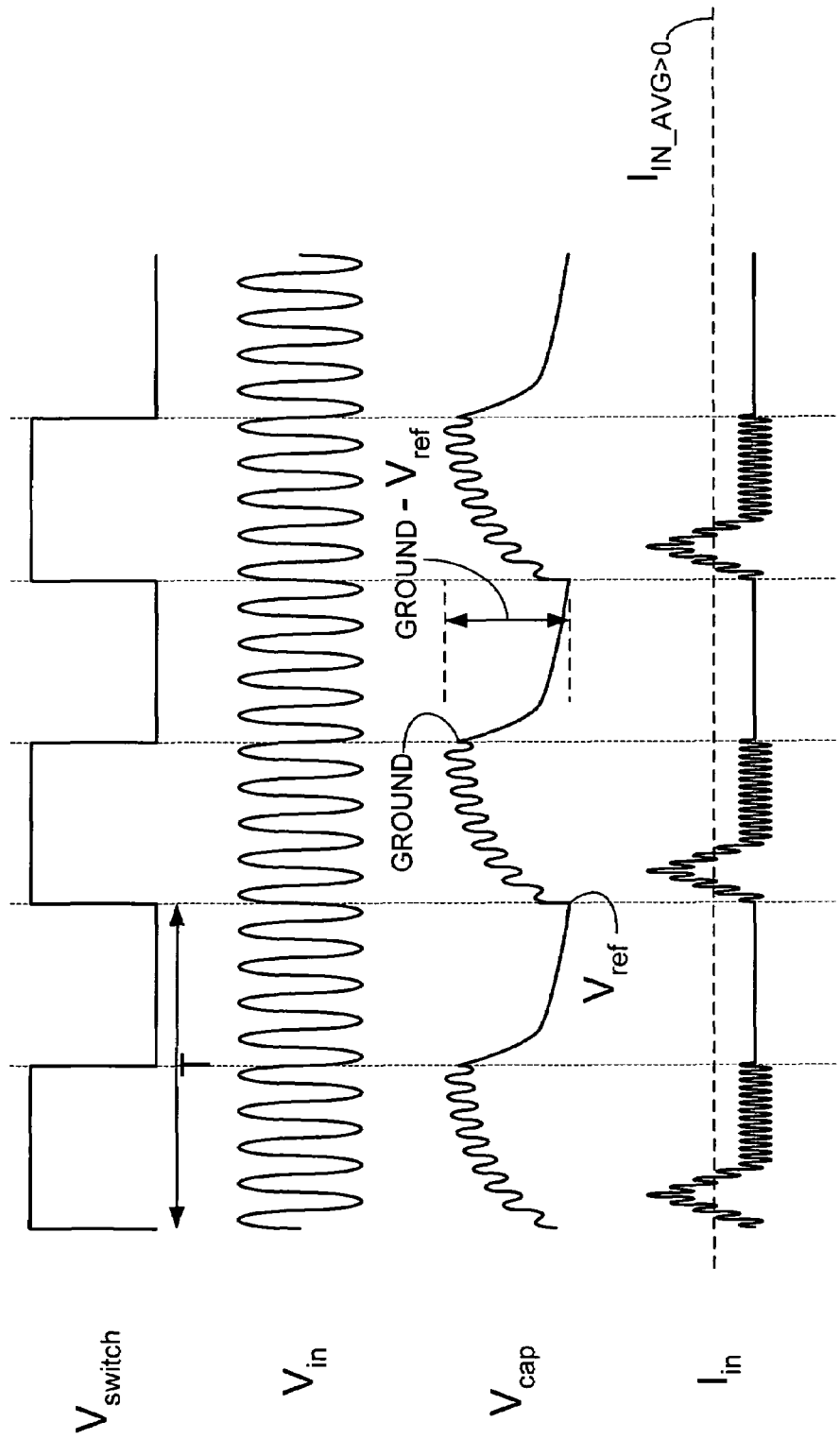
FIG. 9 illustrates voltage/current characteristics for a switched capacitor resistor which is connected to node N wherein $V_{in}$ to the switched capacitor resistor corresponds to the voltage at node N, and $V_{ref}$ is less than ground.

FIG. 9 illustrates characteristics when $V_{ref}$ has a lower potential than ground. In FIG. 9, a low frequency offset is introduced that dominates the high frequency ripple and makes $V_{in}$ quasi-stationary with respect to $V_{switch}$. In FIG. 9, $I_{in\_average}$ is greater than zero. As a result, the effective resistance of R3, and therefore the PLL loop bandwidth, can be modulated.

Although the invention has been described with reference to a specific embodiment, the description is not meant to be construed in a limiting sense. Various modifications of the disclosed embodiment, as well as alternative embodiments of the invention, will become apparent to persons skilled in the art upon reference to the description of the invention. It is therefore contemplated that the claims will cover any such modifications or embodiments that fall within the true scope and spirit of the invention.

What is claimed is:

1. A method of varying the loop bandwidth of a PLL (Phase Lock Loop), comprising the steps of:
   inserting a switched capacitance in a damping resistor leg of a low pass filter portion of the PLL;
   switching the switched capacitance, as a function of a reference frequency and a divided PLL output frequency wherein said function is a substantially continuous difference between the reference frequency and the divided PLL output frequency.

2. The method of claim 1, wherein said switched capacitance is connected in parallel with a damping resistor.

3. The method of claim 2, comprising the additional steps of:
   mixing said reference frequency and said PLL output frequency to generate a difference frequency; and
   applying said difference frequency to said switched capacitor to alternately connect said switched capacitor to opposite ends of said damping resistor.

4. A method of varying the loop bandwidth of a PLL (Phase Lock Loop), comprising the steps of:
   generating a switching signal that is a function of a reference frequency and a divided PLL output frequency, wherein said function is a substantially continuous difference between the reference frequency and the divided PLL output frequency;
   inserting a switchable capacitor in a damping resistor leg of a low pass filter portion of the PLL; and
   varying the effective impedance of the damping resistor leg by switching the connections of said switchable capacitor in accordance with said switching signal.

5. A PLL (Phase Lock Loop), comprising:
   a PFD (Phase Frequency Detector) including first and second inputs and an output;
   a reference signal of frequency F1 connected to said first input of said PFD;
   a VCO (Voltage Controlled Oscillator) including an input and an output providing an output signal of frequency F2 when the PLL is in a stable condition;
   a signal frequency divider, operable to alter the frequency of the VCO output signal by a ratio of F1/F2, connected between said output of said VCO and said second input of said PFD;
   a mixer connected to said first and second inputs of said PFD, said mixer providing a variable frequency output signal F3 indicative of the difference in frequency of the first input and the second input received by said PFD;
   an LPF (Low Pass Filter) connected between said output of said PFD and said input of said VCO and further connected to receive the signal F3 from said output of said mixer; and
   a variable impedance damping resistor which is part of said LPF, the impedance of said variable impedance damping resistor being a function of the frequency of the signal F3.

6. The apparatus of claim 5, wherein:
   said variable impedance damping resistor comprises a switched capacitor circuit; and
   the impedance of said damping resistor increases as the frequency of the signal F3 decreases.

7. A PLL (Phase Lock Loop), comprising:
a PFD (Phase Frequency Detector);
a VCO (Voltage Controlled Oscillator);
a signal frequency divider, operable on the frequency of the VCO output signal by a ratio of F1/F2 where F1 is the frequency of a reference signal used by said PLL and F2 is the desired output frequency of the PLL when in a stable condition; and
an LPF (Low Pass Filter) connected between an output of said PFD and an input of said VCO, said LPF including a variable impedance damping resistor, the impedance of said variable impedance damping resistor varying as a function of a difference between F1 and a signal frequency divider output.

8. Apparatus for use in adaptive control of loop bandwidth in a PLL (Phase Locked Loop) system, comprising:
a PFD (Phase Frequency Detector) means having
  a reference clock input having a corresponding W2 frequency component signal,
  a feedback clock signal having a corresponding W1 frequency component signal, and
  an output signal;
  a switched capacitor circuit with a control input; and
a difference means for developing a control signal corresponding to a substantially continuous difference between said W2 and W1 frequency component signals, said control signal being delivered to said control input of said switched capacitor circuit.

9. A PLL (Phase Lock Loop), comprising:
a PFD (Phase Frequency Detector) including reference first and feedback clock second inputs and an output;
a VCO (Voltage Controlled Oscillator) including an input and an output providing an output signal of a given frequency when the PLL is in a stable condition;
feedback clock means, operable to provide a feedback clock signal, connected between said output of said VCO and said second input of said PFD;
control signal supplying means, connected to said first and second inputs of said PFD, said control signal supplying means providing a control signal F1 indicative of a difference between the reference clock input and the feedback clock input;
an LPF (Low Pass Filter) connected between said output of said PFD and said input of said VCO and further connected to receive the control signal F1 from an output of a mixer; and
a variable impedance damping resistor which is part of said LPF, the impedance of said variable impedance damping resistor being a function of the control signal F1.

* * * * *

UNITED STATES PATENT AND TRADEMARK OFFICE
CERTIFICATE OF CORRECTION

PATENT NO. : 6,980,060 B2 Page 1 of 1
DATED : December 27, 2005
INVENTOR(S) : Boerstler et al.

It is certified that error appears in the above-identified patent and that said Letters Patent is hereby corrected as shown below:

<u>Column 7,</u>
Line 22, after "an output signal;" insert -- an LPF (Low Pass Filter) interconnected to said output signal, said LPF including --.

Signed and Sealed this

Eleventh Day of April, 2006

JON W. DUDAS
*Director of the United States Patent and Trademark Office*